United States Patent
Nam

(10) Patent No.: US 8,268,680 B2
(45) Date of Patent: Sep. 18, 2012

(54) TRANSISTOR OF SEMICONDUCTOR DEVICE AND METHOD OF FABRICATING THE SAME

(75) Inventor: Ki Bong Nam, Seoul (KR)

(73) Assignee: Hynix Semiconductor Inc, Icheon-Si (KR)

(*) Notice: Subject to any disclaimer, the term of this patent is extended or adjusted under 35 U.S.C. 154(b) by 100 days.

(21) Appl. No.: 12/650,455

(22) Filed: Dec. 30, 2009

(65) Prior Publication Data

US 2011/0133288 A1    Jun. 9, 2011

(30) Foreign Application Priority Data

Dec. 4, 2009   (KR) .................. 10-2009-0120158

(51) Int. Cl.
*H01L 21/335*    (2006.01)

(52) U.S. Cl. ........ 438/142; 438/283; 438/199; 438/184; 257/E21.4

(58) Field of Classification Search .............. 438/142, 438/283, 199, 184; 257/E21.4
See application file for complete search history.

(56) References Cited

U.S. PATENT DOCUMENTS

| 6,744,098 | B2 | 6/2004 | Moore | |
| 7,374,998 | B2* | 5/2008 | Hergenrother et al. | 438/287 |
| 7,790,633 | B1* | 9/2010 | Tarafdar et al. | 438/788 |
| 2006/0030109 | A1* | 2/2006 | Ranade et al. | 438/283 |
| 2007/0004156 | A1* | 1/2007 | Rouse et al. | 438/299 |
| 2007/0034963 | A1* | 2/2007 | Sudo | 257/369 |
| 2009/0176380 | A1 | 7/2009 | Shimazu et al. | |
| 2009/0189224 | A1* | 7/2009 | Matsumoto | 257/369 |

FOREIGN PATENT DOCUMENTS

| JP | 2008-306199 A | 12/2008 |
| KR | 1020020084861 A | 11/2002 |
| KR | 1020030068570 A | 8/2003 |
| KR | 1020040008600 A | 1/2004 |

* cited by examiner

*Primary Examiner* — Julia Slutsker

(57) ABSTRACT

A method of fabricating a transistor of a semiconductor device comprises: forming a gate in a NMOS region and a PMOS region of a semiconductor substrate; forming a gate spacer on a sidewall of the gate; performing an ion implantation process on the NMOS region to form a junction region in the NMOS region; depositing an oxide film on the entire surface of the semiconductor substrate including the gate; removing hydrogen (H) existing in the oxide film and the gate spacer; and removing the oxide film in the PMOS region and performing a ion implantation process on the PMOS region to form a junction region in the PMOS region.

9 Claims, 5 Drawing Sheets

US 8,268,680 B2

TRANSISTOR OF SEMICONDUCTOR DEVICE AND METHOD OF FABRICATING THE SAME

CROSS-REFERENCE TO RELATED APPLICATION

The present application claims priority to Korean patent application number 10-2009-0120158, filed on 4 Dec. 2009, which is incorporated by reference in its entirety.

BACKGROUND OF THE INVENTION

The present invention relates to a transistor of a semiconductor device and a method of fabricating the same. More particularly, the present invention relates to a transistor of a semiconductor device including a CMOS transistor and a method of fabricating the same.

A semiconductor device such as a dynamic random access memory (DRAM) has a cell region and a peripheral region. In the peripheral region, the semiconductor device uses complementary metal oxide semiconductor (CMOS) technology. Generally, in CMOS devices, a P-type MOS transistor has a buried channel structure. As the integration of the device has increased, a channel length in this buried channel structure is reduced. As a result, leakage current characteristics become degraded due to the high electric field. Accordingly, a dual gate structure having a symmetrical pair of N-type and P-type MOS transistors has been employed. The dual gate structure means a structure in which a P-type gate injecting P-type impurities is arranged where a PMOS transistor is to be formed and a N-type gate injecting N-type impurities is arranged where a NMOS transistor is to be formed.

However, the current in the PMOS transistor of the CMOS transistors may be reduced due to various reasons. For example, the amount of boron (B) in a source/drain region, which is a junction region of the PMOS transistor, may be decreased which reduces the PMOS current. The mobility of the PMOS transistor may also be decreased when the PMOS transistor is subjected to a tensile stress, thereby reducing the PMOS current.

BRIEF SUMMARY OF THE INVENTION

An embodiment of the present invention is directed to a transistor of a semiconductor device and a method of fabricating the same in which hydrogen existing in an oxide film is removed to provide an effect of preventing boron out-diffusion, and to reduce the tensile stress applied to a PMOS transistor due to a nitride film to increase a PMOS current.

To achieve the above purpose, the method of fabricating a transistor of a semiconductor device according to the present invention comprises: forming a gate in a NMOS region and a PMOS region of a semiconductor substrate; forming a gate spacer on a sidewall of the gate; performing an ion implantation process on the NMOS region to form a junction region in the NMOS region; depositing an oxide film on the entire surface of the semiconductor substrate including the gate; removing hydrogen (H) existing in the oxide film and the gate spacer; and removing the oxide film in the PMOS region and performing a ion implantation process on the PMOS region to form a junction region in the PMOS region, thereby preventing boron out-diffusion by removing the hydrogen existing in the oxide film.

Further, the removing hydrogen preferably includes performing a $N_2$ or $H_2$ plasma process on the oxide film. In particular, the performing the $N_2$ or $H_2$ plasma process on the oxide film is taken under a pressure in the range of 400 mTorr to 10 Torr at a power in the range of 100 W to 3 kW and a temperature in the range of 25° C. to 500° C., preferably.

In addition, the method according to the present invention further comprises after the performing the $N_2$ or $H_2$ plasma process on the oxide film, depositing a nitride film spacer on the entire surface of the semiconductor substrate including the oxide film.

In addition, the performing the ion implantation process on the NMOS region preferably includes: forming a mask exposing the NMOS region; injecting ions into the exposed NMOS region; and removing the mask. Also, the performing the ion implantation process on the PMOS region preferably includes: forming a mask exposing the PMOS region; injecting ions into the exposed PMOS region; and removing the mask.

In addition, the method according to the present invention further comprises after depositing the nitride film spacer, removing the nitride film spacer in the PMOS, thereby reducing the tensile stress applied to the PMOS transistor due to the nitride film.

Further, the method according to the present invention further comprises before depositing the nitride film spacer on the gate of a cell region, removing the oxide film formed on the gate of the cell region, preferably.

On the other hand, a transistor of a semiconductor device according to the present invention comprises: a gate formed on NMOS and PMOS regions of a semiconductor substrate, respectively; a junction region formed between the gate of the NMOS and PMOS regions, and a neighboring semiconductor substrate; and an oxide film formed only over the junction region of the NMOS region, thereby preventing boron out-diffusion by removing hydrogen existing in the oxide film.

In addition, the oxide film is preferably an oxide film in which hydrogen (H) is removed.

Also, the transistor according to the present invention further comprises a gate spacer formed on a sidewall of the gate in the NMOS and PMOS regions.

Further, the transistor according to the present invention further comprises a nitride film spacer deposited on the NMOS region, preferably.

DESCRIPTION OF EMBODIMENT

The present invention will be described in detail in connection with an embodiment of the present invention with reference to accompanying drawings.

Figure 1:
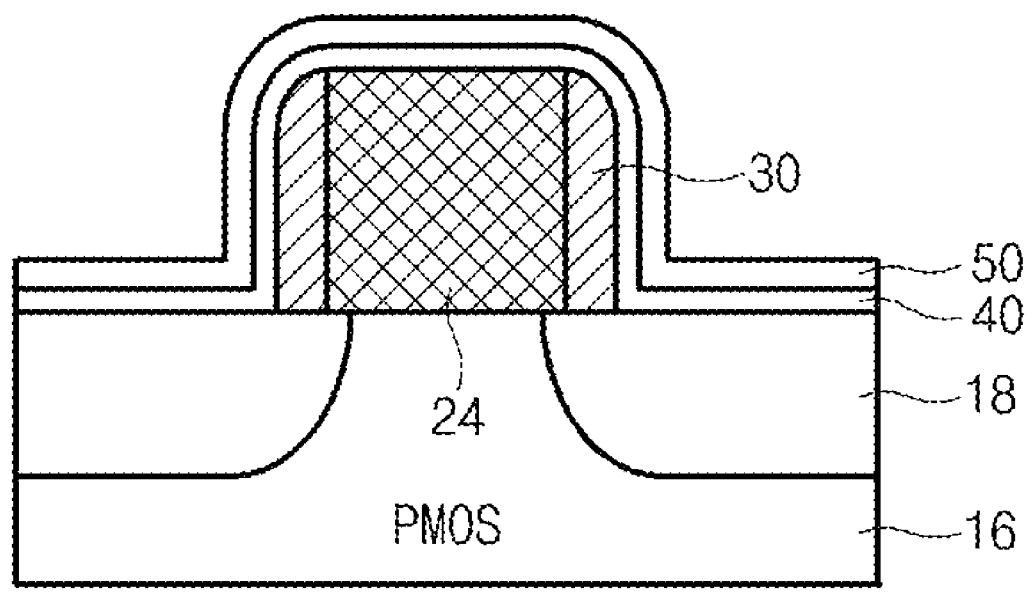
FIG. 1 is a view illustrating a transistor of a semiconductor device.

FIG. 1 is a view illustrating a PMOS transistor of a semiconductor device. Referring to FIG. 1, on a substrate of a PMOS transistor, a gate 24 is formed to be protruded therefrom, a gate spacer 30 is formed of an oxide material on a sidewall of the gate 24 with a given thickness. Ions are injected into the semiconductor substrate under the gate 24 to form an N well 16. P+ ions are injected into the semiconductor substrate on both sides of the gate to form a P+ ion implantation region 18, that is, a source/drain region, thereby forming a transistor.

In addition, an oxide film 40 is formed on the entire surface including the gate 24, the gate spacer 30 and the semiconductor substrate with a given thickness, and a nitride film spacer 50 is formed thereon with a given thickness. During the formation of a nitride film spacer on a gate of the cell region, a nitride film spacer 50 with the same structure is formed in the peripheral region as well. Also, the oxide film 40 underlying the nitride film spacer 50 is configured so as to prevent a surface of the substrate (which is made of Si material) from being damaged by directly coming in contact with the nitride film spacer.

In this structure, both the gate spacer 30 and the oxide film 40 directly come in the contact with the P+ ion implantation region 18 of the substrate. Therefore, due to the hydrogen in the gate spacer 30 and the oxide film 40, boron in the P+ ion implantation region 18 migrates toward the gate spacer 30 and the oxide film 40, that is, an out-diffusing phenomenon occurs. As a result, the current of the PMOS transistor is reduced when the amount of boron in the source/drain region 18 is decreased.

In addition, the nitride film spacer 50 is made of a material which causes a tensile stress. Due to this nitride film spacer 50, the mobility of the PMOS transistor is decreased with the tensile stress applied, which reduces the PMOS current.

Figure 2:
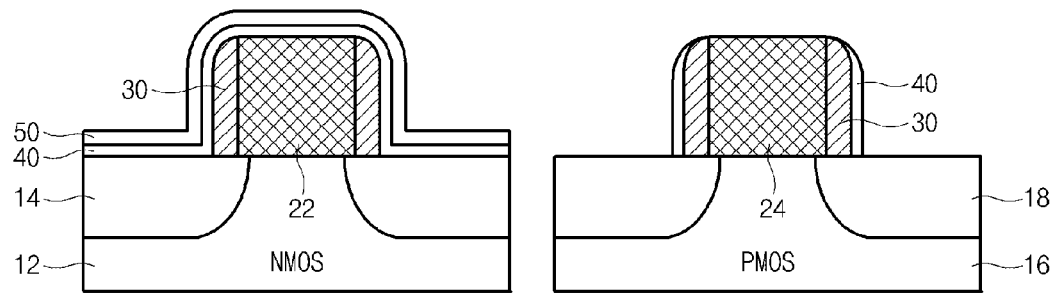
FIG. 2 is a view illustrating a transistor of a semiconductor device according to an embodiment of the present invention.

FIG. 2 is a view illustrating a transistor of a semiconductor device according to an embodiment of the present invention. Referring to FIG. 2, the structure of the NMOS transistor shown on left side is similar to that of the transistor shown in FIG. 1, whereas the structure of the PMOS transistor on right side is different from the example shown in FIG. 1. Specifically, it is different from the example shown in FIG. 1 in that the nitride film spacer 50 is not formed on the PMOS transistor of FIG. 2; and the oxide film 40 remains only on the sidewall of the gate spacer 30. In addition, the remaining oxide films 30 and 40 are the oxide film in which hydrogen is removed through the N2 or H2 plasma process used in the example shown in FIG. 1.

Meanwhile, looking at the structure of the NMOS transistor shown on left side in FIG. 2, it is equal to that of the PMOS transistor in the example of FIG. 1 in that the gate spacer 30 is formed on the sidewall of the gate 22, and the oxide film 40 and the nitride film spacer 50 are formed thereon. However, there is a difference in the way ions are injected into the P well 12 and N+ ions are injected into the ion implantation region 14 of the present embodiment from the example of FIG. 1.

Since the embodiment of the present invention shown in FIG. 2 has such a structure, it can help prevent the reduced current of the example shown in FIG. 1. First, because hydrogen in the gate spacer 30 and the oxide film 40 is removed, it can increase the PMOS current by preventing the boron out-diffusion in the P+ ion implantation region 18. Also, since the nitride film spacer 50 does not exist in the PMOS transistor, the tensile stress in the PMOS transistor can be prevented.

FIGS. 3 through 6 are views illustrating a method of fabricating a transistor of a semiconductor device according to an embodiment of the present invention. The method of fabricating a transistor of a semiconductor device shown in FIG. 2 is examined with reference to FIGS. 3 through 6.

Figure 3:
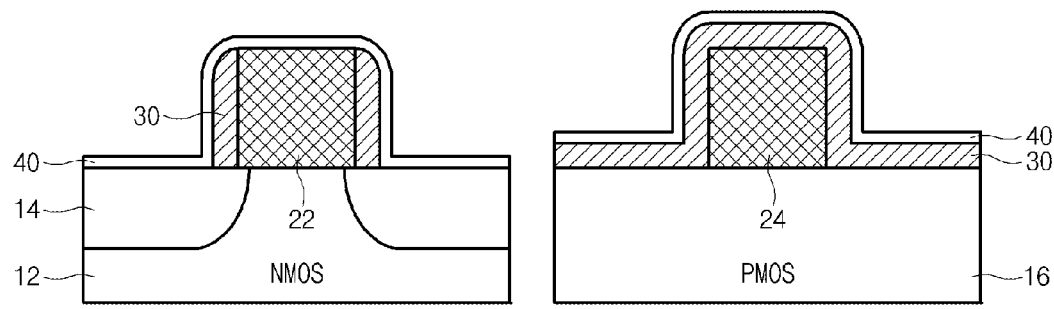
FIGS. 3 through 6 are views illustrating a method of fabricating a transistor of a semiconductor device according to the present invention.

First, referring to FIG. 3, a NMOS gate 22 and a PMOS gate 24 are formed on a semiconductor substrate. Next, a gate spacer 30 is deposited over an entire surface including two gates 22 and 24. In addition, prior to depositing the oxide film 40 over the gate spacer 30, an ion implantation process is performed only on the NMOS region unlike the conventional method.

That is, as long as the PMOS region is covered with a mask (e.g., a photoresist film, not shown), the gate spacer 30 existing on the semiconductor substrate and the gate 22 is etched from the NMOS regions only. Then a N+ ion implantation region 14 is formed through a N+ ion implantation process. At this time, in the PMOS region, the ion implantation process is not performed, because the gate spacer 30 remains on the entire surface in the PMOS region including the gate 24 and the semiconductor substrate.

Thereafter, an oxide film 40 is deposited over the NMOS and PMOS regions. This oxide film 40 is formed in order to protect the semiconductor substrate from the nitride film spacer 50 as described above with the reference to FIG. 2.

Figure 4:
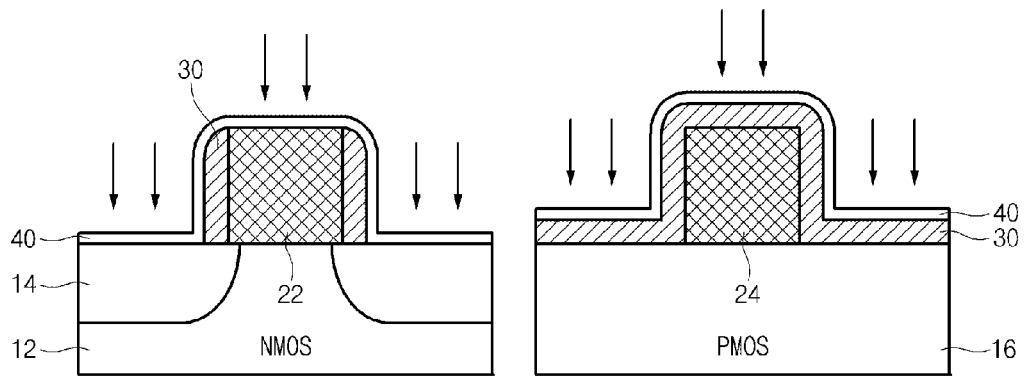
Figure 7:
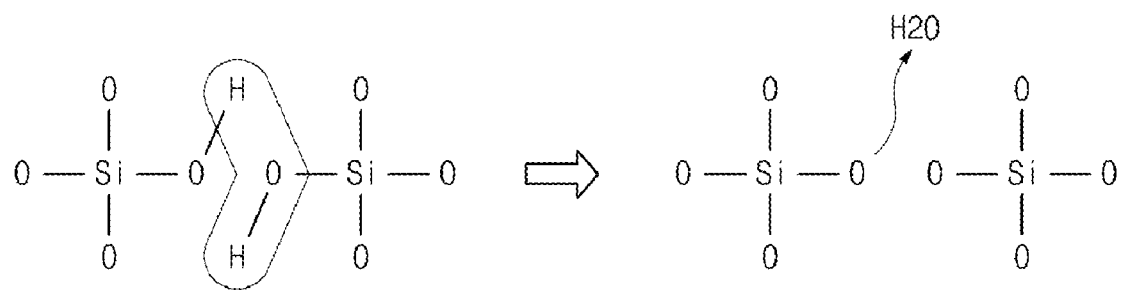
FIG. 7 is a reaction formula in a plasma process of a method of fabricating a transistor of a semiconductor device according to the present invention.

Next, as shown in FIG. 4, a process for removing the hydrogen (H) existing in the gate spacer 30 and the oxide film 40 is performed. A $H_2$ or $N_2$ plasma process (marked by arrows of FIG. 4) may be used. $H_2$ or $N_2$ plasma is irradiated on the entire surface including the gate spacer 30 and the oxide film 40. As a result, hydrogen ions existing in the gate spacer 30 and the oxide film 40 are combined with Oxygen to produce $H_2O$. The $H_2O$ is then exhausted as vapor. In this $H_2$ or $N_2$ plasma process, the reaction formula in which the hydrogen ions are combined with Oxygen to produce $H_2O$ is shown in FIG. 7

This $H_2$ or $N_2$ plasma process is performed under a pressure in the range of 400 mTorr to 10 Torr at a power in the range of 100 W to 3 kW and a temperature in the range of 25° C. to 500° C. with only a $N_2$ gas or a mixture gas of $N_2$ and $H_2$ gases. Since the hydrogen ions in the gate spacer 30 and the oxide film 40 are removed due to this process, boron out-diffusion from a source/drain region of the PMOS region can be prevented and increase the PMOS current.

Figure 5:
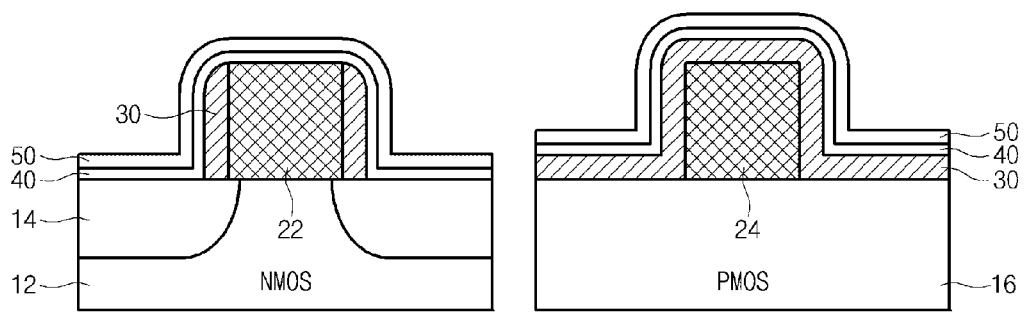

Thereafter referring to FIG. 5, a nitride film spacer 50 is formed over the surface of the oxide film 40 on which the $H_2$ or $N_2$ plasma process has been done. This process forms the nitride film spacer over the gate of a cell region (not shown). In the cell region, prior to this process, the process for removing the gate spacer 30 and the oxide film 40 is first performed. This nitride film spacer 50 is deposited on both the NMOS and PMOS regions to apply a tensile stress to the semiconductor substrate. As a result, the tensile stress works to increase the current of the NMOS region and to decrease the current of the PMOS region.

Figure 6:
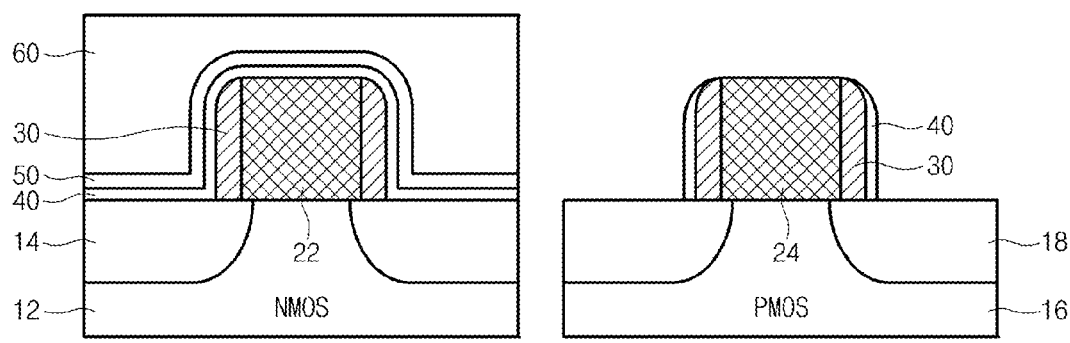

Next, as shown in FIG. 6, a mask 60 (e.g., a photoresist film) which exposes only the PMOS region while covering the NMOS region, is formed over the NMOS region. A P+ ion implantation is performed on the PMOS region. In particular, in the PMOS region, the nitride film spacer 50 and the oxide film 40 are first removed by etching, and then a portion of the gate spacer 30 and the oxide film 40 would remain on the sidewall of the PMOS gate 24. After that, the P+ ion implantation process is performed on the PMOS region to form the P+ ion implantation region 18, which becomes a source/drain region. In addition, the mask 60 covering the NMOS region is removed in FIG. 6 to complete the transistor of the semiconductor device shown in FIG. 2.

Since the PMOS ion implantation process is performed after the process of depositing the nitride film spacer 50 in the embodiment of the present invention, the nitride film spacer 50 can be removed through the PMOS ion implantation process to increase the PMOS current.

In the transistor of the semiconductor device formed with the method described hitherto according to the present invention, since in the PMOS region, the hydrogen in the gate spacer 30 and the oxide film 40 is removed and the oxide film 40 and gate spacer 30 remains only on the sidewall of the gate, the boron in the P+ ion implantation region 18 can be prevented from being out-diffused, thereby increasing the PMOS current.

In addition, the nitride film spacer 50 exists only on the NMOS region, thus it help the NMOS current by maintaining the tensile stress on the NMOS region. On the other hand, the nitride film spacer 50 on the PMOS region is removed, so that the tensile stress in the PMOS region is reduced which increases the PMOS current.

As described hitherto, the transistor of the semiconductor device and the method of fabricating the same according to the present embodiment is configured to present boron out-diffusion by removing hydrogen existing in the oxide film, and increasing the PMOS current by reducing the tensile stress applied to the PMOS transistor due to the nitride film.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method of fabricating a transistor of a semiconductor device, the method comprising:
    forming a gate electrode in an NMOS region and a PMOS region of a semiconductor substrate;
    forming gate spacers over sidewalls of the gate electrodes;
    implanting first dopants in the NMOS region to form a first junction region in the NMOS region;
    depositing an oxide film over the gate electrode, the gate spacers, and the NMOS and PMOS regions of the semiconductor substrate;
    removing hydrogen (H) atoms from the oxide film and the gate spacers disposed over the gate electrode in the NMOS region and the gate electrode in the PMOS region to reduce a level of hydrogen in the oxide film and a level of hydrogen in the gate spacers;
    after the step of removing hydrogen atoms, removing a portion of the oxide film provided over the PMOS region, wherein the oxide film remains over the NMOS region; and
    implanting second dopants in the PMOS region to form a second junction region in the PMOS region,
    wherein the first dopants and the second dopants have different conductivity.

2. The method of claim 1, wherein the removing hydrogen atoms includes:
    performing a N2 or H2 plasma process on the oxide film, wherein the first dopants are n-type dopants, and the second dopants are p-type dopants.

3. The method of claim 2, wherein the N2 or H2 plasma process is performed in a chamber having pressure of 400 mTorr to 10 Torr, with applied power of 100 W to 3 kW at a temperature of 25° C. to 500° C.

4. The method of claim 1, further comprising depositing a nitride film spacer over the gate electrode, the gate spacers, and the NMOS and PMOS regions.

5. The method of claim 1, wherein implanting the first dopants includes:
    forming a mask exposing the NMOS region;
    injecting the first dopants into the exposed NMOS region; and
    removing the mask.

6. The method of claim 1, wherein implanting the second dopants includes:
    forming a mask exposing the PMOS region;
    injecting ions into the exposed PMOS region; and
    removing the mask.

7. The method of claim 4, further comprising after depositing the nitride film spacer, removing a portion of the nitride film spacer provided over the PMOS region.

8. The method of claim 7, further comprising before depositing the nitride film spacer on the gate electrode of a cell region, removing a portion of the oxide film formed over the gate electrode of the cell region.

9. The method of claim 1, wherein the step of removing a portion of the oxide film provided over the PMOS region includes preserving portions of the oxide film disposed over the gate spacers disposed over the electrode in the PMOS region.

* * * * *